United States Patent [19]

Shibata

[11] Patent Number: 5,017,993
[45] Date of Patent: May 21, 1991

[54] SEMICONDUCTOR INTEGRATED CIRCUIT DEVICE WITH BUS LINES

[75] Inventor: Manabu Shibata, Takasaki, Japan

[73] Assignee: Hitachi, Ltd., Tokyo, Japan

[21] Appl. No.: 482,077

[22] Filed: Feb. 20, 1990

[30] Foreign Application Priority Data

Feb. 20, 1989 [JP] Japan ............................ 1-40528

[51] Int. Cl.⁵ ............................................ H01L 27/02
[52] U.S. Cl. ........................................ 357/40; 357/45; 357/43; 357/71
[58] Field of Search ............... 357/45, 43, 71, 40

[56] References Cited

FOREIGN PATENT DOCUMENTS

| | | | |
|---|---|---|---|
| 60-76141 | 4/1985 | Japan ................................. | 357/45 |
| 63-285945 | 11/1988 | Japan ................................. | 357/45 |
| 63-310134 | 12/1988 | Japan ................................. | 357/45 |
| 1-4055 | 1/1989 | Japan ................................. | 357/45 |

OTHER PUBLICATIONS

Denshi Zairyo (Elect. Matls) Jul. 87, pp. 49–52, Kogyo Chosakai, Co., Inc.

*Primary Examiner*—Jerome Jackson, Jr.
*Attorney, Agent, or Firm*—Antonelli, Terry, Stout & Kraus

[57] ABSTRACT

A semiconductor integrated circuit device, in which a system including a plurality of modules (functional blocks) such as a microprocessor unit and a memory unit is integrated on the main surface of a single semiconductor substrate, and each module of the system is connected through its corresponding interface circuits to the external terminals. The external terminals and the interface circuits are provided on the main surface of said semiconductor substrate, and are connected through an internal bus line commonly used between said modules. Also, and commonly use or internal bus line is connected directly to said external terminals to permit connection to a common external bus line.

12 Claims, 3 Drawing Sheets

SEMICONDUCTOR INTEGRATED CIRCUIT DEVICE WITH BUS LINES

BACKGROUND OF THE INVENTION

The present invention relates to a semiconductor integrated circuit device, and, particularly, to an effective technique applicable to a semiconductor integrated circuit device having a system including a microprocessor.

With increased integration of semiconductor devices, the development of an integration of all the systems including a microprocessing module in one semiconductor substrate, the so-called one chip microprocessor, is in progress. A semiconductor integrated circuit device of this kind is far superior in its high-speed performance to the system made up with a printed circuit board on which a plurality of semiconductor integrated circuit devices having each module (functional block) of said system integrated on a separate semiconductor substrate are mounted.

The inventor hereof is now developing an ASIC (Application Specific Integrated Circuit: IC dedicated for a specific use) as a semiconductor integrated circuit device. Among ASIC's, a semiconductor integrated circuit device using a standard cell method of a custom method has a plurality of modules of said system arranged in the central portion of the main surface of a semiconductor substrate (semiconductor chip) which is rectangular on its plane. The modules are automatically arranged as macro cell which forms functional blocks or circuit blocks in accordance with an automatic wiring distribution system (Design Automation). In the circumference of said system, each of the interface circuits (I/O buffering circuits) and external terminals (bonding pads) are sequentially arranged in the direction towards outside from the system side.

The semiconductor integrated circuit device using said standard cell method is mounted on a printed circuit board and is connected to a common external bus line provided on the printed circuit board. Each of the system modules integrated on the semiconductor integrated circuit device and the common external bus line provided on he printed circuit board are connected through said interface circuits and external terminals.

In this respect, there is known, for example, an article disclosing said ASIC on pp. 49–52 of July, 1987 issue of Denshi Zairyo (Electronic Materials) published by Kogyo Chosakai, Co, Inc.

SUMMARY OF THE INVENTION

Prior to the development of the semiconductor integrated circuit device using said standard cell method, the inventor hereof found that there was such problems as subsequently described.

The semiconductor integrated circuit device using the standard cell has each of the interface circuits and external terminals arranged in the circumference of the system. In other words, a plurality of modules (functional blocks) forming said system are connected to the common external bus line each individually through the respective interface circuit and external terminal which are closely arranged. A connecting method of this kind requires that the number of the signal wirings between the modules and the common external bus line has to be increased by the numbers equivalent to the product of the numbers of signal wirings of the common external bus line and those of the modules arranged to form said system. As a result, there arises a problem of lowering the mounting efficiency of circuits of the semiconductor integrated circuit device using the standard cell method because the available area in the semiconductor substrate for the installation of the modules of said system becomes smaller.

In addition, although the employment of complementary MISFET (hereinafter referred to as CMOS) has an advantage in achieving a higher integration of said semiconductor integrated circuit device using the standard cell method, the load driving capacity of the interface circuits becomes less when, for example, signals are output to the common external line from each module of said system through the interface circuits made up with CMOS. It is, therefore, impossible to drive directly through the common external bus line the external devices provided outside the semiconductor substrate with each of said modules formed thereon. In order to overcome this difficulty, it becomes necessary to mount externally a device for intensifying the load driving capacity between the semiconductor integrated circuit device using the standard cell method and the common external bus line. This also causes a problem of tightening the packaging density of the printed circuit board.

The purpose of the present invention is to provide a technique to improve the mounting efficiency of circuits in a semiconductor integrated circuit device having a system including a microprocessing module.

Another purpose of the present invention is to provide a technique for operating a system at a higher speed in a semiconductor integrated circuit device having the system including a microprocessing module.

Still another purpose of the present invention is to provide a technique for intensifying the driving capacity of the external devices in a semiconductor integrated circuit device having a system including a microprocessing module.

The further purpose of the present invention is to provide in a semiconductor integrated circuit device having a system including a processing module a technique for improving the mounting efficiency of circuits and intensifying the driving capacity of external devices simultaneously.

Still further purpose of the present invention is to provide a technique for improving the mounting density in an electronic device having a board with said semiconductor integrated circuit device mounted thereof.

Said purposes and others of the present invention and novel features thereof will become clear by the description of the present specification and the accompanying drawings.

Among the inventions to be disclosed in this application, the typical ones will subsequently be described briefly.

In a semiconductor integrated circuit device having a system integrated on the main surface of a semiconductor substrate with a plurality of modules such as a microprocessor unit and a memory unit, each module of which is connected to an external terminal through an interface circuit, said external terminals and interface circuits are connected respectively through a common internal bus line between said modules. Each module and internal bus line of said system are respectively arranged by an automatic wiring distribution system.

Furthermore, said common internal bus line between the modules is arranged in the central portion of said semiconductor substrate, and each module of said system is arranged along both sides of the internal bus line on the main surface of the semiconductor substrate.

Also, said common internal bus line between the modules is arranged on the main surface of the semiconductor substrate along the outer circumference of said system.

Also, the interface circuits connected to said common internal bus line between modules are formed in a smaller area than the one occupied by the interface circuits connected to the signal wirings other than those of said internal bus line.

Then, the interface circuits connected to said common internal bus line between modules are arranged in the region in which the interface circuits connected to the signal wirings other than those of said internal bus line are arranged. In other words, the internal circuits connected to the internal bus line are arranged along the array of the interface circuits connected to the signal wirings.

Also, the interface circuits connected to said common internal bus line are made up with bipolar transistors at least at their output stage.

According to the structure mentioned above, it is unnecessary to arrange interface circuits and external terminals in the respective numbers corresponding to those of each signal wirings of the common external bus line for each of the modules of said system. Thus the numbers of the interface circuits and external terminals to be arranged are reduced because it suffices if only the interface circuits and external terminals are arranged in numbers corresponding to the numbers of each of the signal wirings of said internal bus line. As a result, the mounting efficiency of the modules can be improved.

Furthermore, the wiring length of said internal bus line is minimized so that the incidental capacity of load resistance on the internal bus line can be lowered so as to increase the transfer speed of signals on the internal bus line. Thus, the system can be operated at a higher speed.

Also, against said system region (the region in which the modules are arranged), a substantially independent empty space is provided, and as said internal bus line can be arranged in such an empty space, the mounting efficiency of said modules is improved to the extent of the obtainability of the space equivalent to the area occupied by said internal bus line. Also, each module of said system is arranged in a region substantially independent of said internal bus line, so that the arrangement of each module is not restricted by that of the internal bus line. As a result, each module of the system can be arranged more flexibly.

Also, as the area occupied by the interface circuits connected to said internal bus line can be reduced, the mounting efficiency of said modules is improved.

In addition to the reduction of the area occupied by the interface circuits connected to said internal bus line, the total area occupied by the interface circuits, i.e., these interface circuits and the ones connected to the signal wirings other than those of said internal bus line, is also reduced so that the mounting efficiency of the modules can be improved.

It is also possible to intensify the driving capacity of the interface circuits connected to said internal bus line. As a result, when said semiconductor integrated circuit device is mounted on a printed circuit board, the external devices can be driven directly by said interface circuits. Thus, it becomes unnecessary to have any external devices dedicated only for intensifying the driving capacity. Consequently, the mounting density of the printed circuit board can be improved.

DESCRIPTION OF A PREFERRED EMBODIMENT

Figure 1:
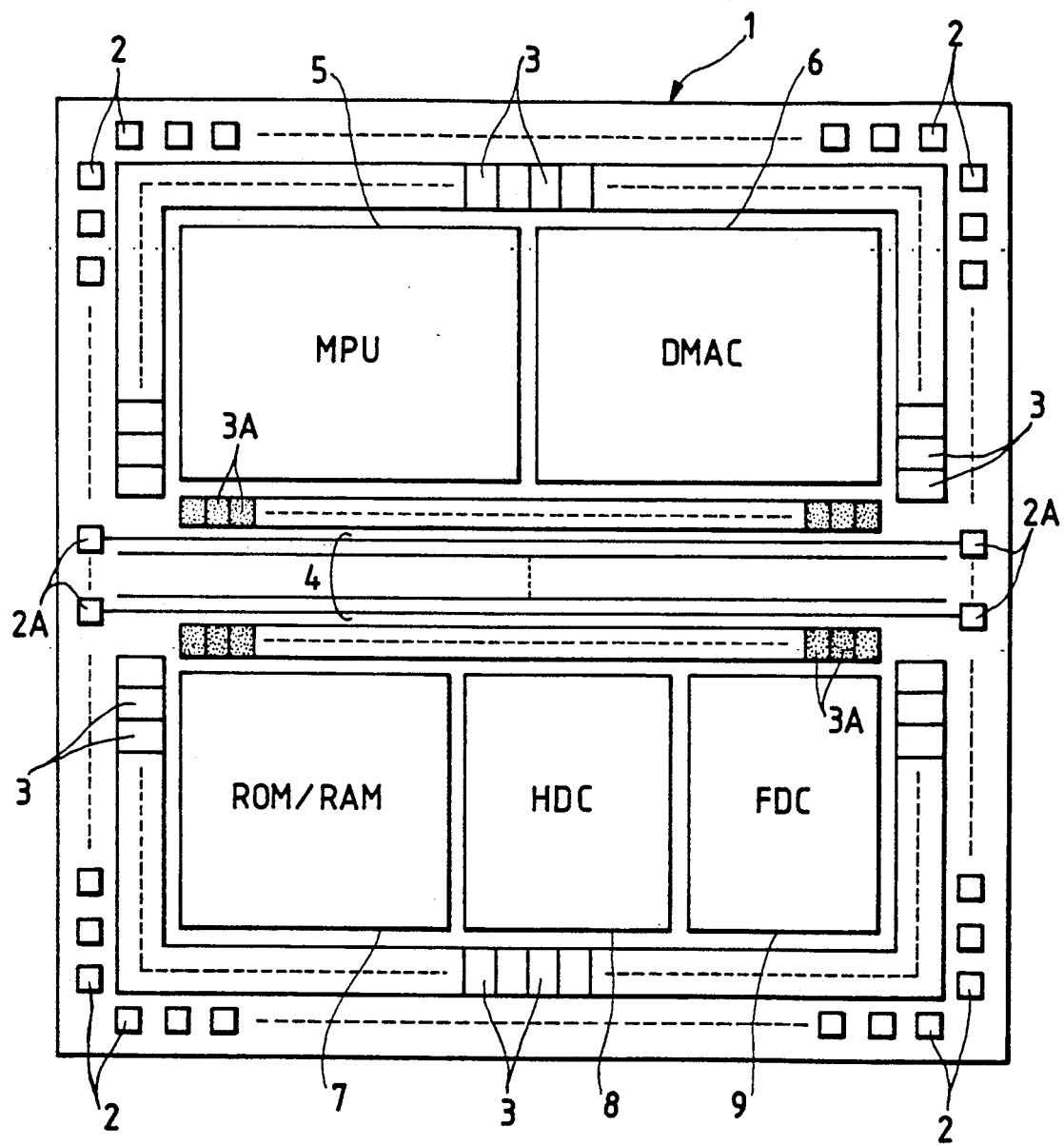
FIG. 1 is a chip layout showing the fundamental structure of a semiconductor integrated circuit device having a system including a microprocessor unit according to the embodiment I of the present invention.

In accordance with the embodiment in which the present invention is applied to a semiconductor integrated circuit device using a standard cell method of a custom ASIC, the structure of the present invention will subsequently be described.

Here, in the drawings to which the description of the embodiment is referred, those having the same functions are given identical signs, and their explanations are not repeated.

EMBODIMENT I

The fundamental structure of a semiconductor integrated circuit device using the standard cell method with a system including a microprocessing module according to the embodiment I of the present invention is shown in FIG. 1 (a chip layout).

As shown in FIG. 1, the semiconductor integrated circuit device 1 is a rectangular chip in its plan (for example, a monolithic silicon substrate). This semiconductor integrated circuit device 1 is formed by the standard cell method of a custom type, although it is not limited to such a method.

On the central portion of the rectangular semiconductor integrated circuit device 1, a logic system including a microprocessor unit (MPU) 5 is mounted. Said logic system is made up, though not limited to, such units as a direct memory access controller unit (DMAC) 6, a memory unit (ROM/RAM) 7, a hard disk controller unit (HDC) 8 and a floppy disk controller unit (FDC) 9 in addition to the microprocessor unit 5. Each of these units 5 to 9 comprising the logic system is respectively a unit of module representing one functional block or circuit block. Each of these units 5 to 9 is automatically arranged on the semiconductor substrate as a macro cell in the automatic wiring distribution system (DA). Among said unit 5 to 9, the memory unit 7 is formed by such a RAM as either a DRAM or an SRAM, or both and also formed by such a ROM as either one of a mask, ROM, an EPROM, an EEPROM or a combination of these ROM's.

In this embodiment, the microprocessor unit 5 and the direct memory access controller unit 6 of said logic system are arranged on the upper side of the main surface of the semiconductor substrate of the semiconductor integrated circuit device 1, and the memory unit 7, the hard disk controller unit 8 and the floppy disk controller unit 9 of said logic system are arranged on the lower side of the main surface of the semiconductor substrate of the semiconductor integrated circuit device 1. Each of these units 5 to 9 of said logic system is made up with circuits formed mainly by CMOS for the fundamental purpose of a higher integration thereof. The respectivecircuits of said units 5 to 9 for which a driving capacity is required, such as their output circuits, are formed by bipolar transistors or by compound circuits made up with bipolar transistor and CMOS. In other words, the semiconductor integrated circuit device 1 of this embodiment is formed by the so-called Bi-CMOS which allows bipolar transistor and CMOS to coexist with each other on the main surface of the same and one semiconductor substrate.

Along each side of said logic system of said semiconductor integrated circuit device 1, i.e., the rectangular chip, a plurality of interface circuits (input/output buffering circuits) 3 are arranged, and further along the outer circumference of the interface circuits 3 of the semiconductor integrated circuit device 1, a plurality of the external terminals (bonding pads) 2, 2A are arranged respectively.

The semiconductor integrated circuit device 1 of this embodiment is formed in a double-layer structure, although it is not limited thereto. In other words, the semiconductor elements or circuit blocks, each of which comprises each of the units 5 to 9 of said logic system, are connected with each other by signal wirings made up mainly with the double-layer wirings. The signal wirings made up with each wiring layer having the double-layer wiring structure is formed by, for example, aluminum wirings. Each of said external terminals 2, 2A is produced in the same and one manufacturing process in which said signal wirings are produced in the wiring layer of the second layer (and/or the first layer).

Of said external terminals 2, 2A, the external terminals 2 are used as the ones for the input or output signals for connecting each of the units 5 to 9 of the logic system of the semiconductor integrated circuit device 1 and the external device arranged outside the semiconductor integrated circuit device 1. The external terminals 2 are each arranged in almost all the circumferential region of said logic system.

Figure 3:
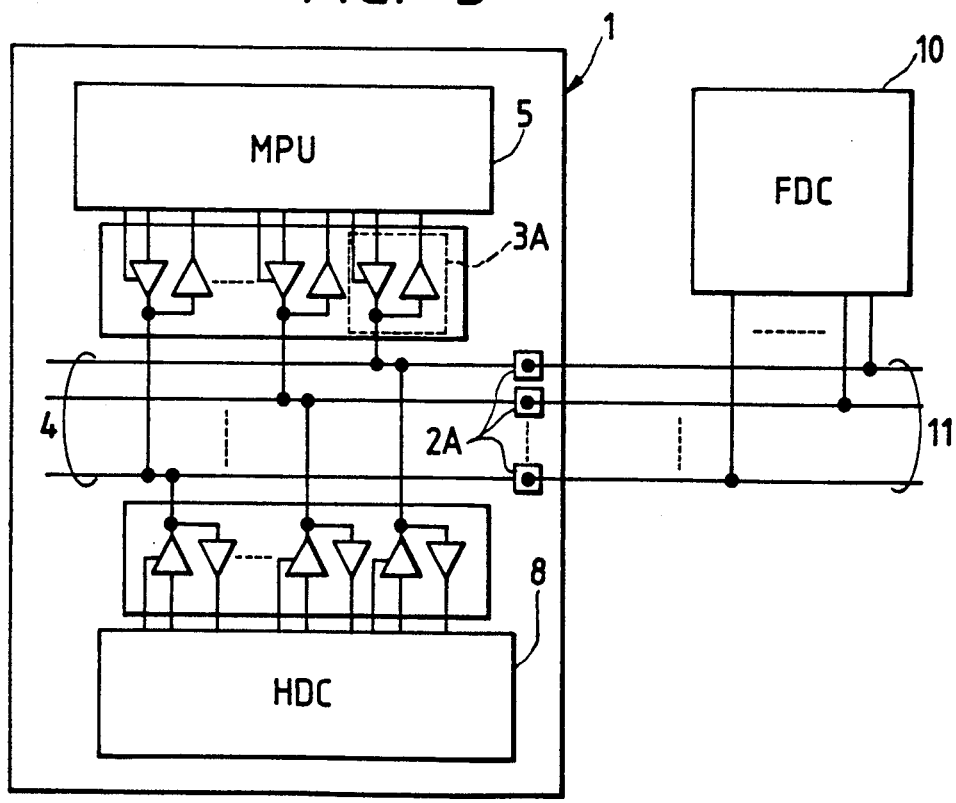
FIG. 3 is a schematic block diagram showing said semiconductor integrated circuit device of the present invention mounted on a printed circuit board.

Of said external terminals 2, 2A, the external terminals 2A connect, as shown in FIG. 3 (a schematic block diagram showing the state when mounted on a printed board), each of the common internal bus lines (common signal wirings) 4 arranged within the semiconductor integrated circuit device 1 and the common external bus line 11 arranged outside the semiconductor integrated circuit device 1. In other words, the external bus line 2A is used as the one dedicated only for the input or output signals for the bus line. A plurality of the external terminals 2A are arranged each on the central portions of the two opposite sides of a rectangular chip of the semiconductor integrated circuit device 1 of this embodiment.

The common internal bus line 4 connected to said external terminals 2A used only for the bus line is arranged on the central portion of the semiconductor integrated circuit device 1. Specifically, the common internal bus line 4 is arranged between the units 5 and 6 located at the upper side of the semiconductor integrated circuit device 1 and the units 7 to 9 located at the lower side thereof. In other words, this common internal bus line 4 extends across from one side of the opposite two sides of the rectangular chip to the other side (in the transverse direction in FIG. 1). The common internal bus line 4 constitutes signal wirings common to each of the units 5 to 9 of said logic system. The common internal bus line 4 is made up with a plurality of signal wirings extending substantially in parallel in the same and one direction with a given wiring pitch. The common internal bus line 4 is formed as an integrated body having approximately several tens to several hundreds of wirings which transfer common signals in such systems as clock, data, addressing and controlling. The common internal bus line 4 is formed in either one of the wiring layers of the double-layer wiring structure.

Although the common external bus line 11 is not shown in FIG. 1, it is arranged on a printed circuit board on which, for example, the semiconductor integrated circuit device 1 is mounted. On the printed circuit board, the external device 10 having a floppy disk controller (FDC) and others are mounted as shown in FIG. 3. The external device 10 and the semiconductor integrated circuit device 1 are respectively connected with each other through the common external bus line 11 as previously described. The common external bus line 11 is made up with approximately the same number of signal wirings as said common internal bus line 4.

Figure 2:
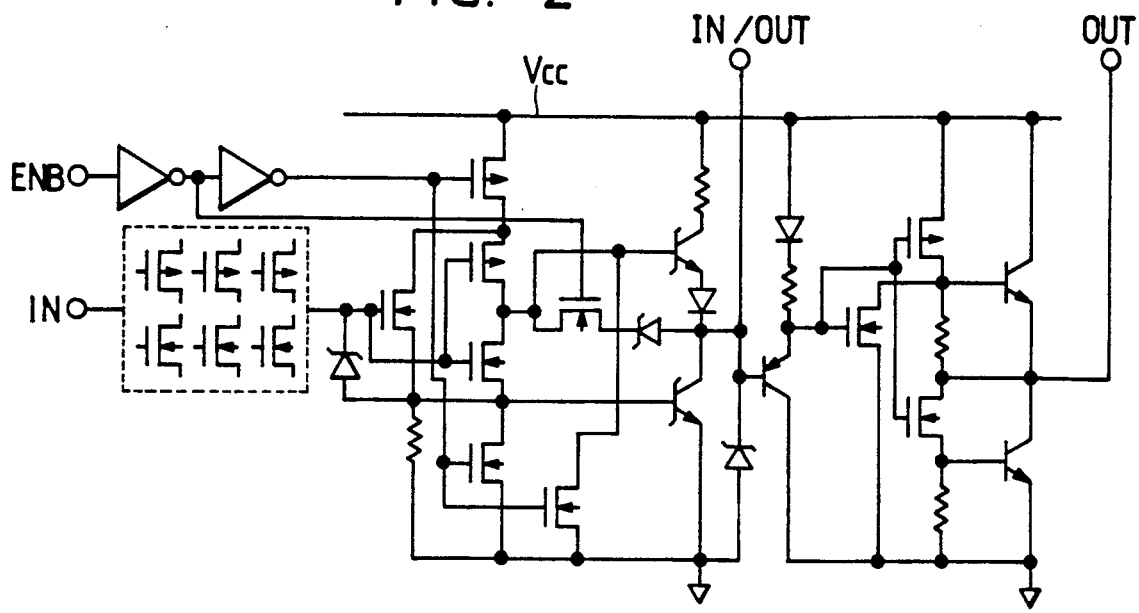
FIG. 2 is a diagram showing the equivalent circuits of the interface circuits of said semiconductor integrated circuit device of the present invention.

A plurality of said interface circuits 3 are respectively arranged between the units 5 to 9 of said logic system and the external terminals 2. The interface circuits 3 are formed as interface circuits connecting said units 5 to 9 and the respectively external devices. The interface circuits 3 are formed by, for example, three-state buffering circuits as shown in FIG. 2 (an equivalent circuit diagram). The interface circuits 3 shown in FIG. 2 are made up mainly with CMOS, bipolar transistors, resistance elements and Schottky barrier diode elements. Particularly, the interface circuits 3 are formed in a totem pole structure having bipolar transistors at their output stage for intensifying driving capacity when they are provided for the output use. In FIG. 2, IN is an input signal terminal, OUT is an output signal terminal, ENB is an enable buffer signal terminal, and Vcc is a power terminal (wiring). The interface circuits 3 are formed by connecting each semiconductor element for the interface circuit cells arranged in advance on a semiconductor substrate by a fundamental design on each of said semiconductor elements with the wirings provided in the first layer of the wiring layer of said double-layer wiring structure.

As shown in FIG. 1, between each of the units 5 and 6 arranged at the upper side of said semiconductor integrated circuit device 1 and the units 7 to 9 arranged at the lower side thereof and the common internal bus line 4, a plurality of interface circuits 3A are arranged. The interface circuits 3A are arranged between each of the units 5 to 9 of said logic system and the common internal bus line 4 are connected with each other. The interface circuits 3A have almost the same structure as the interface circuits 3 except that several CMOS's arranged in the vicinity of the input signal terminal IN shown in FIG. 2 (CMOS's in the region surrounded by dotted lines) are not provided. In other words, the interface circuits 3A are formed in a smaller area than the interface circuits 3 by the size equivalent to the area occupied by said several CMOS's. The interface circuits 3A are formed by connecting each semiconductor element for interface circuit cells with the wiring layer of the first layer as in the case of said interface circuits 3.

Thus, in the semiconductor integrated circuit device 1 in which a logic system including a plurality of such units (modules) 5 to 9 as a microprocessor unit 5, a memory unit 7 and others is integrated on the main surface of a semiconductor substrate, and each of the units 5 and 6 of the logic system is connected to the external terminals 2A through the interface circuits 3A, and each of said external terminals 2A and interface circuits 3A is connected with each other through the common internal bus line 4 provided between each of said units 5 to 9. In other words, each of the units 5 to 9 of the logic system of the semiconductor integrated circuit device 1 and the common external bus line 11 is connected from the side of each of said units 5 to 9 sequentially through the interface circuits 3A, the common internal bus line 4 and the external terminals 2A respectively. This structure makes it unnecessary to arrange the interface circuits 3A and the external terminals 2A each in response to the number of the respective signal wirings of the common external bus line 11 for each of the units 5 to 9 of said logic system. It suffices if only the interface circuits 3A and the external terminals 2A are arranged each in the number corresponding to the number of the respective wirings of said common internal bus line 4. Thus, the required numbers in which the interface circuits 3A and the external terminals 2A can be reduced so as to improve the mounting efficiency of the units. In other words, the integration of the semiconductor integrated circuit device 1 can be improved.

Furthermore, said common internal bus line 4 is arranged in the central portion of said semiconductor substrate, and each of the units 5 to 9 of said logic system is arranged on the main surface of the semiconductor substrate along both sides of the common internal bus line 4. By this structure, the wiring length of said common internal bus line 4 is minimized so that the accidental capacity or loaded resistance on the common internal bus line 4 can be reduced. Thus, the transfer speed of the signals in the common internal bus line 4 is made faster so that the operation of the logic system can carried out at a higher speed. In other words, the operational speed of the semiconductor integrated circuit device 1 can be made faster.

Also, the interface circuits 3A connected to said common internal bus line 4 are formed in a smaller area than the area occupied by the interface circuits 3 connected to signal wirings other than those of said common internal bus line 4. By this structure, the area occupied only by the interface circuits 3A connected to said common internal bus line 4 can be reduced so as to improve the mounting efficiency of said units.

Furthermore, the interface circuits 3A connected to said common internal bus line 4 are formed by bipolar transistors at least at their output stage. By this structure, the driving capacity of the interface circuits 3A connected to said common internal bus line 4 is more intensified than it is formed by CMOS. As a result, when said semiconductor integrated circuit device 1 is mounted on a printed circuit board, the external device 10 can be driven directly only by said interface circuits 3A. Thus, there is no need of outside devices dedicated for intensifying the driving capacity so that the mounting density of a printed circuit board can be improved. In other words, in an electronic device having a printed circuit board on which a plurality of semiconductor integrated circuit devices are mounted, the number of parts is reduced so that the mounting efficiency can be improved. Also, since the bipolar transistor has a higher resistance against electrostatic breakage than CMOS transistors have, each of the interface circuits 3A and 3 is protected against electrostatic breakage.

Furthermore, the common internal bus line 4 is provided in said semiconductor integrated circuit device 1. Although the common internal bus line 4 is automatically arranged by the automatic wiring distribution system, it is arranged in a fixed pattern such as power wirings separately from those signal wirings connecting each of units 5 to 9 or logic circuits arranged within each of the units 5 to 9. Thus, by arranging the common internal bus line 4 in a fixed pattern by the automatic wiring distribution system, the wiring loads on the respective signal wirings of the common internal bus line 4 can be equalized. Particularly, since each of the units 5 to 9 is made up mainly with CMOS, skew is prevented. As a result, the operation of said logic system can be carried out at a higher speed because, although CMOS depends more on the wiring load for its operational speed, it allows the wiring load of the common internal bus line 4 to be equalized.

EMBODIMENT II

The embodiment II is the second embodiment of the present invention wherein the common internal bus line is arranged in the circumference of said logic system in the semiconductor integrated circuit device using the standard cell method described in said embodiment I.

Figure 4:
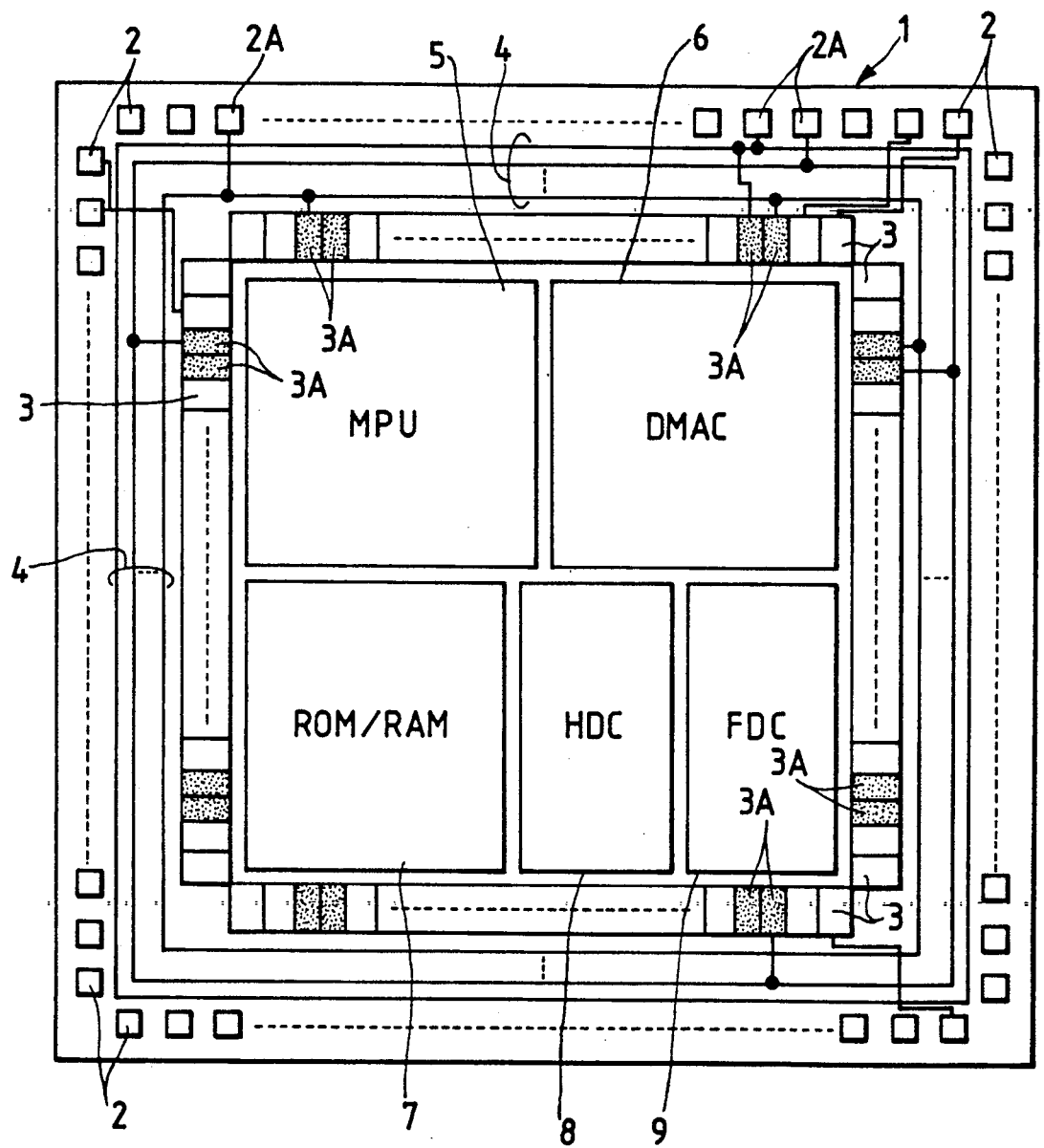
FIG. 4 is a chip layout showing the fundamental structure of a semiconductor integrated circuit device having a system including a microprocessor unit according to the embodiment II of the present invention.

The fundamental structure of the semiconductor integrated circuit device using the standard cell method having a system including a microprocessor unit which is the second embodiment of the present invention is shown in FIG. 4 (a chip layout).

As shown in FIG. 4, the semiconductor integrated circuit device 1 of the embodiment II has the common internal bus line 4 arranged in the circumference of the logic system formed by the microprocessor unit 5 and others. In other words, the common internal bus line 4 is arranged between the interface circuits 3 and 3A and the external terminals 2 and 2A (or may be arranged around the external terminals 2), so that it surrounds said logic system in a ring.

A plurality of interface circuits 3 are arranged between said logic system and internal bus line 4. The interface circuits 3A dedicated only for the bus line provided between each of the units 5 to 9 and the common internal bus line 4 is arranged regularly or at random along the array of the interface circuits 3 in the region in which the interface circuits 3 are arranged. Also, among said external terminals 2, such external terminal 2 as arranged in a given region such as the vicinity of the interface circuit 3A is connected to the common internal bus line 4 in the process of wiring formation and is used as the external terminal 2A dedicated only for bus line.

In this way, the common internal bus line 4 is arranged on the main surface of a semiconductor substrate along the out circumference of said logic system in the semiconductor integrated circuit device 1 using said standard cell method. By this structure, in addition to the effects obtainable in said embodiment I, the mounting efficiency of said logic system can be improved to the extent corresponding to the area that would be occupied by said common internal bus line 4 because said common internal bus line 4 can be arranged in a space substantially independent of the region in which said logic system is mounted (the region where each of the units 5 to 9 is arranged). Furthermore, each of the units 5 to 9 of said logic system is in a region substantially independent of said common internal bus line 4 so that the arrangement of the units 5 to 9 is not restricted by that of the common internal bus line 4. Thus, each of the units 5 to 9 of the logic system can be arranged more flexibly.

Also, the interface circuits 3A connected to said common internal bus line 4 are arranged in the region in which the interface circuits 3 connected to the signal wirings other than those of said common internal bus line 4 is arranged. In other words, the interface circuits 3A connected to the common internal bus line 4 are arranged along the array of the interface circuits 3 connected to the signal wiring. By this structure, the area occupied by the interface circuits 3A connected to said common internal bus line 4 is reduced so that the total area occupied by the interface circuits 3A and the interface circuits 3 connected to such other wirings as previously described can be reduced. Thus, the mounting efficiency of the logic system can be improved.

Furthermore, since said interface circuits 3A can interchangeably be used as 3 and the interface circuit 3 as 3A, the units 5 to 9 of semiconductor integrated circuit device 1 can be arranged more flexibly.

As set forth above, the invention of the present invention has been described specifically according to said embodiment. The present invention, however, is not limited thereto, and obviously, many modifications and variations of the present invention are possible without departing from the purport thereof.

For example, in ASIC, the present invention is respectively applicable to a semiconductor integrated circuit device using the full custom type of a custom method and a semiconductor integrated circuit device using the semi custom type of a gate array method.

Also, the present invention is applicable to a semiconductor integrated circuit device having a multiple-layer wiring structure such as three layers or more.

Here, the effects of the typical inventions among those disclosed in this application will subsequently be described.

In the semiconductor integrated circuit device having a system including a microprocessor module, the mounting efficiency of circuits can be improved.

In the semiconductor integrated circuit device having a system including a microprocessing module, the operation of the system can be carried out at a higher speed.

In the semiconductor integrated circuit device having a system including a microprocessing module, the driving capacity of external devices can be intensified.

In the semiconductor integrated circuit device having a system including a microprocessing module, while the mounting efficiency of the circuits can be improved, the driving capacity of external devices can be intensified.

In an electronic device, on the circuit board of which said semiconductor integrated circuit device is mounted, the mounting device can be improved.

What is claimed is:

1. A semiconductor integrated circuit device comprising:
   (a) a semiconductor substrate having a main surface;
   (b) a plurality of functional blocks provided on said main surface of the semiconductor substrate, said blocks including at least a microprocessor unit;
   (c) a plurality of interface circuits provided around said plurality of functional blocks on the main surface of the semiconductor substrate, said interface circuits being coupled to said functional blocks corresponding thereto;
   (d) a plurality of external terminals arranged at a peripheral portion of the main surface of said semiconductor substrate; and
   (e) an internal bus comprised of a plurality of signal lines provided on said semiconductor substrate and commonly used between said functional blocks, wherein said plurality of interface circuits and said plurality of external terminals are coupled to one another through said internal bus.

2. A semiconductor integrated circuit device according to claim 1, wherein said internal bus is arranged substantially in a central portion of said semiconductor substrate, and wherein said functional blocks are respectively arranged in predetermined locations along both sides of said internal bus in a predetermined direction in which it extends.

3. A semiconductor integrated circuit device according to claim 1, wherein said internal bus is arranged on the main surface of the semiconductor substrate adjacent to said external terminals.

4. A semiconductor integrated circuit device according to claim 1, further comprising signal lines other than those of said internal bus provided on the main surface of said semiconductor substrate and a plurality of other interface circuits provided on the main surface of said semiconductor substrate, being coupled to the signal lines other than those of said internal bus, wherein each of the interface circuits coupled to said internal bus is formed in a smaller area than an area occupied by each of the other interface circuits coupled to the signal lines other than those of said internal bus.

5. A semiconductor integrated circuit device according to claim 4, wherein the interface circuits coupled to said internal bus are arranged in a predetermined region in which the other interface circuits coupled to the signal lines other than those of said internal bus are arranged.

6. A semiconductor integrated circuit device according to claim 1, wherein the interface circuits coupled to said internal bus include a bipolar transistor as an output stage transistor.

7. A semiconductor integrated circuit device according to claim 1, wherein said internal bus is connected directly to said external terminals.

8. A semiconductor integrated circuit device according to claim 2, wherein the arrangements of each of said functional blocks and the internal bus are determined by use of an automatic design.

9. A semiconductor integrated circuit device according to claim 2, wherein a first set of said external terminals is arranged adjacent one side of said substrate, and a second set of said external terminals is arranged at an opposite side of said substrate, and further wherein said internal bus is arranged to extend between said first and second set of external terminals.

10. A semiconductor integrated circuit device according to claim 1, further comprising a common external bus coupled to said external terminals such that a plurality of signal lines of said common external bus are coupled to said functional blocks through said external terminals, said plurality of signal lines of said common internal bus and said interface circuits.

11. A semiconductor integrated circuit device according to claim 9, further comprising a common external bus coupled to said external terminals such that a plurality of signal lines of said common external bus are coupled to said functional blocks through said external terminals, said plurality of signal lines of said common internal bus and said interface circuits.

12. A semiconductor integrated circuit device according to claim 3, wherein at least predetermined ones of said external terminals are arranged to be in line with one another along a predetermined direction, and wherein at least a portion of said internal bus is arranged to extend adjacent to said peripheral portion of said main surface of said semiconductor substrate between said interface circuits and said predetermined ones of said external terminals in a direction substantially parallel to said predetermined direction.

* * * * *